United States Patent
Jeong et al.

(10) Patent No.: US 8,330,338 B2
(45) Date of Patent: Dec. 11, 2012

(54) DOUBLE-SIDED LIGHT EMITTING DISPLAY DEVICE

(75) Inventors: Hee-Seong Jeong, Yongin (KR); Sung-Soo Koh, Yongin (KR); Soon-Ryong Park, Yongin (KR); Woo-Suk Jung, Yongin (KR); Chul-Woo Jeong, Yongin (KR); Il-Ryong Cho, Yongin (KR); Tae-Kyu Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 40 days.

(21) Appl. No.: 13/006,650

(22) Filed: Jan. 14, 2011

(65) Prior Publication Data

US 2011/0175513 A1 Jul. 21, 2011

(30) Foreign Application Priority Data

Jan. 21, 2010 (KR) .................. 10-2010-0005747

(51) Int. Cl.
*H05B 33/00* (2006.01)
*H01J 1/62* (2006.01)

(52) U.S. Cl. .................. 313/112; 313/504; 313/506
(58) Field of Classification Search .................. 313/504, 313/506, 110–114
See application file for complete search history.

(56) References Cited

U.S. PATENT DOCUMENTS

| 7,561,231 | B2 | 7/2009 | Kanbe et al. |
| 7,928,639 | B2 * | 4/2011 | Adachi ................ 313/112 |
| 2004/0195962 | A1 | 10/2004 | Nakamura et al. |
| 2004/0227698 | A1 | 11/2004 | Yamazaki et al. |
| 2004/0251823 | A1 | 12/2004 | Park et al. |
| 2008/0101087 | A1 * | 5/2008 | Hwang et al. ............ 362/619 |
| 2009/0201442 | A1 | 8/2009 | Onishi et al. |
| 2009/0284670 | A1 * | 11/2009 | Xue .................. 349/16 |
| 2010/0142048 | A1 * | 6/2010 | Chou et al. ............ 359/487 |

FOREIGN PATENT DOCUMENTS

| JP | 2005038608 | 2/2005 |
| JP | 2005108540 | 4/2005 |
| JP | 2009109549 | 5/2009 |
| KR | 1020040047670 A | 6/2004 |
| KR | 20040102651 | 12/2004 |
| KR | 20080040511 A | 5/2008 |

OTHER PUBLICATIONS

Korean Office action issued by Korean Industrial Property Office on Apr. 29, 2011, corresponding to Korean Patent Application No. 10-2010-0005747 and Request for Entry of the Accompanying Office Action herewith.

* cited by examiner

*Primary Examiner* — Karabi Guharay
(74) *Attorney, Agent, or Firm* — Robert E. Bushnell, Esq.

(57) ABSTRACT

A double-sided light-emitting display device includes optical layers having transmissive axes perpendicular to each other and polarizing members having polarization axes parallel with the transmissive axes of the optical layers. Thus, loss of internal light and reflection of external light are greatly reduced.

18 Claims, 5 Drawing Sheets

DOUBLE-SIDED LIGHT EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 21$^{st}$ of Jan. 2010 and there duly assigned Serial No. 10-2010-0005747.

BACKGROUND OF THE INVENTION

1. Field of the Invention

The present invention relates to a double-sided light-emitting display device and, more particularly, to a double-sided light-emitting display device having high linear polarization efficiency.

2. Description of the Related Art

In general, an organic light-emitting diode (OLED) display device is a self-emitting device and thus has wide viewing angles, high contrast, and the like. Also, since the OLED device does not need a backlight unit, the OLED device can be made light and thin, consume a small amount of power, and cannot limit a light emission direction. Therefore, a double-sided light-emitting display device can be easily manufactured.

SUMMARY OF THE INVENTION

One aspect of this disclosure provides an improved double-sided light-emitting display device.

Another aspect of this disclosure provides a double-sided light-emitting display device capable of reducing loss of internal light and reflection of external light.

According to an aspect of the present invention, a double-sided light-emitting display device may be constructed with a first electrode, a second electrode opposite to the first electrode, an emission layer (EML) disposed between the first and second electrodes, a first optical layer formed on a surface of the first electrode, and a second optical layer formed on a surfaces of the second electrode. The first and second optical layers have transmissive axes perpendicular to each other.

According to another aspect of the present invention, a double-sided light-emitting display device may be constructed with a first electrode, a second electrode opposite to the first electrode, an emission layer (EML) disposed between the first and second electrodes, a first optical layer formed on a surface of the first electrode, a second optical layer formed on a surface the second electrode, a first polarizing member positioned on a path of light emitted from the emission layer, passing through the first optical layer toward an exterior of the double-sided light-emitting display device, and a second polarizing member positioned on a path of light emitted from the emission layer, passing through the second optical layer toward an opposite exterior of the double-sided light-emitting display device. The first and second optical layers have transmissive axes perpendicular to each other.

The first optical layer may be positioned on an outer surface of the first electrode facing an exterior of the double-sided light-emitting display device, and the second optical layer may be positioned on an outer surface of the second electrode facing an opposite exterior of the double-sided light-emitting display device.

Each one of the first and second optical layers may include linearly reflective type polarizing materials. The linearly reflective type polarizing materials may be double brightness enhanced films (DBEFs).

Each one of the first and second optical layers may have a reflective axis perpendicular to the respective transmissive axis.

The first electrode may be a transflective electrode. The first electrode may include a transflective layer, and may further include a transparent layer formed on the transflective layer.

The second electrode may be a transflective electrode.

A polarization axis of the first polarizing member may be parallel with the transmissive axis of the first optical layer, and a polarization axis of the second polarizing member may be parallel with the transmissive axis of the second optical layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
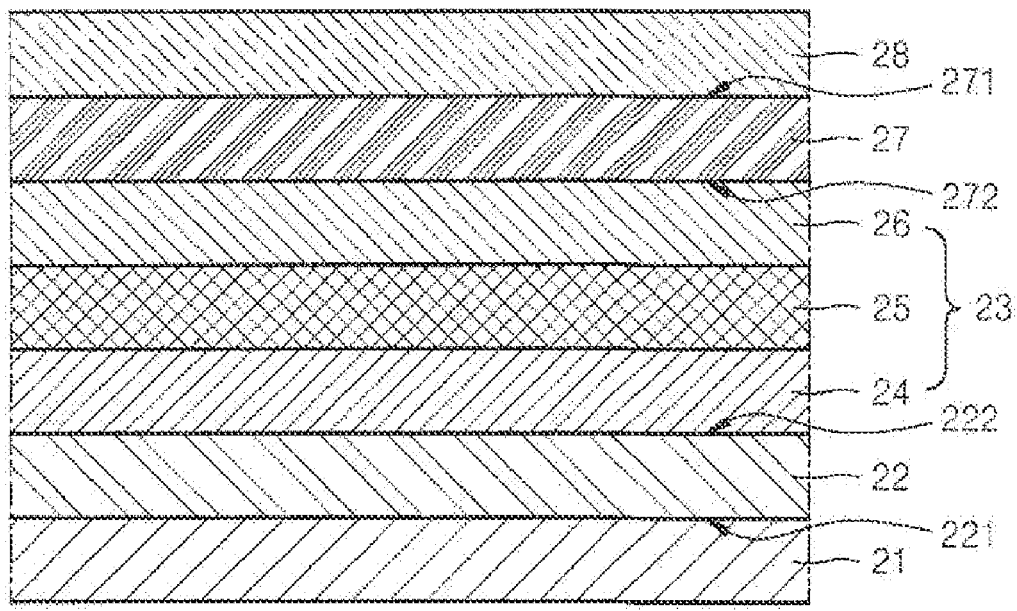
FIG. 1 is a schematic cross-sectional view of a double-sided light-emitting display device constructed as an embodiment according to the principles of the present invention.

A double-sided emission structure has relatively lower resonance efficiency than a top-emission structure or a bottom-emission structure and thus it is difficult for the double-sided emission structure to obtain high out-coupling efficiency. The out-coupling efficiency is generally referred to as a ratio of the amount of light extracted from a light emitting device to the amount of light generated in the light emitting device. When an image is seen in outdoor daylight such as sunlight, a contrast of the image is lowered due to light reflected from a double-sided light-emitting display device. A circularly polarizing plate is used to improve such contrast. In this case, all light corresponding to polarized light is absorbed when internal light passes through the circularly polarizing plate, thereby reducing the internal light.

Exemplary embodiments of the present invention will now be described with reference to the accompanying drawings. In the drawings, like reference numerals denote like elements. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the size and relative sizes of layers and regions may be exaggerated for clarity. It will be understood that when an element such as a layer, film, region or substrate is referred to as being "on" another element, it can be directly on the other element or intervening elements may also be present.

Figure 2:
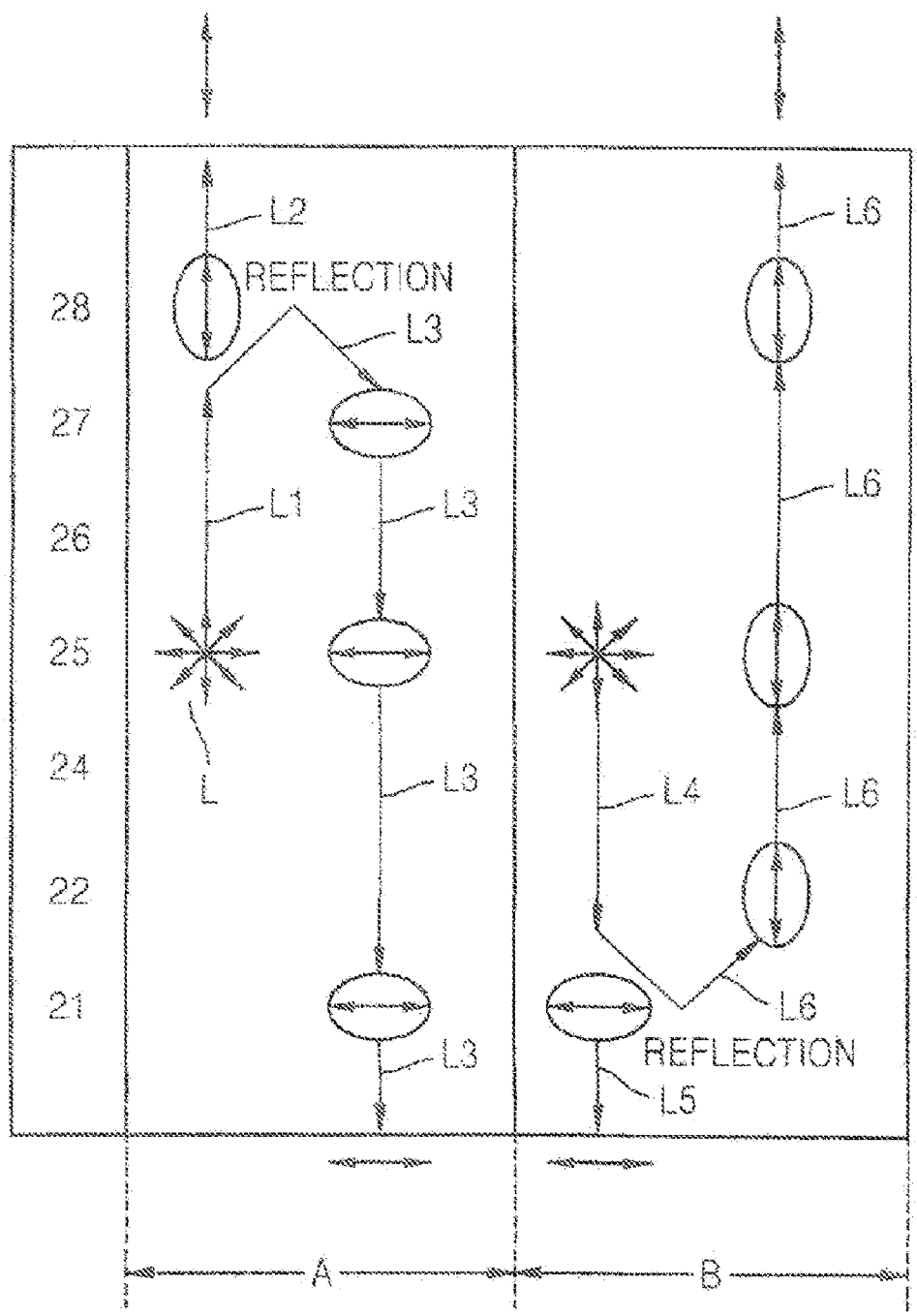
FIG. 2 is a diagram illustrating a polarized state of internal light emitted from the double-sided light-emitting display device of FIG. 1.

FIG. 1 is a schematic cross-sectional view of a double-sided light-emitting display device constructed as an embodiment according to the principles of the present invention, and FIG. 2 is a diagram illustrating a polarized state of light emitted from the double-sided light-emitting display device of FIG. 1.

Referring to FIG. 1, the double-sided light-emitting display device includes a first electrode 22, a second electrode 27 opposite to first electrode 22, an intermediate layer 23 intervening between first and second electrodes 22 and 27, and first and second optical layers 21 and 28 respectively positioned on outer surfaces 221 and 271 of first and second electrodes 22 and 27. In the present embodiment, first and second optical layers 21 and 28 are formed on outer surfaces 221 and 271 of first and second electrodes 22 and 27. But, the present invention is not limited to this structure. That is, first and second optical layers 21 and 28 may be formed on inner surfaces 222 and 272 of first and second electrodes 22 and 27. Or, alternatively, first optical layer 21 may be formed on outer surface 221 of first electrode 22, and second optional layer 28 may be formed on inner surface 272 of second electrode 27. Still alternatively, first optical layer 21 may be formed on inner surface 222 of first electrode 22, and second optional layer 28 may be formed on outer surface 271 of second electrode 27.

First electrode 22 is formed above a lower substrate (not shown) and functions as an anode electrode. Second electrode 27 is positioned opposite to first electrode 22 and functions as a cathode electrode. Polarities of first and second electrodes 22 and 27 may be opposite to each other.

First electrode 22 may be a transflective electrode that can reflect and transmit visible light. First electrode 22 may include a transflective layer, and may further include a transparent layer formed on the transflective layer. The transflective layer is formed of silver (Ag), magnesium (Mg), aluminum (Al), platinum (Pt), palladium (Pd), gold (Au), nickel (Ni), neodymium (Nd), iridium (Ir), chromium (Cr), or a compound of Ag, Mg, Al, Pt, Pd, Au, Ni, Nd, Ir, and Cr. The transparent layer is formed of indium tin oxide (ITO), indium zinc oxide (IZO), zinc oxide (ZnO), or indium (III) oxide ($In_2O_3$). The transparent layer may be formed on the transflective layer.

Second electrode 27 may be a transflective electrode and may be formed of Ag, Mg, Al, Pt, Pd, Au, Ni, Nd, Ir, Cr, or a compound of Ag, Mg, Al, Pt, Pd, Au, Ni, Nd, Ir, and Cr.

Intermediate layer 23 includes an emission layer (EML) 25 and functional layers 24 and 26 formed of a hole injection layer (HIL), a hole transport layer (HTL), an electron transport layer (ETL), an electron injection layer (EIL), and the like with respect to EML 25. The HIL, the HTL, the ETL, the EIL, and the like may be stacked in various structures such as a single stack structure and a multi-stack structure.

Intermediate layer 23 may be formed of a low or high molecular weight organic material.

If intermediate layer 23 is formed of the low molecular weight organic material, a HIL, a HTL, an EML, an ETL, an EIL, and the like may be stacked in a single stack structure or a multi-stack structure to form intermediate layer 23. The low molecular weight organic material may be copper phthalocyanine (CuPc), N,N-Di(naphthyalene-1-yl)-N,N-diphenyl-benzidine (NPB), tris-8-hydroxyquinoline aluminum (Alq3), or the like. These low molecular weight organic materials may be formed using masks and a vacuum evaporation method.

If intermediate layer 23 is formed of the high molecular weight organic material, intermediate layer 23 may include a HTL and an EML. Here, the HTL is formed of poly(3,4-ethylenedioxythiophene) (PEDOT), and the EML is formed of a high molecular weight organic material such as a polyphenylenevinylene (PPV)-based material, a polyfluorene (PFO)-based material, or the like.

Intermediate layer 23 may include red (R), green (G), and blue (B) EMLs in each pixel. An optical distance between first and second electrodes 22 and 27 of each pixel may be controlled using auxiliary layers having different thicknesses in different pixels.

First optical layer 21 is positioned on outer surface 221 of first electrode 22, and second optical layer 28 is positioned on outer surface 271 of second electrode 27. Each one of first and second optical layers 21 and 28 has a transmissive axis along which light oscillating in a specific direction is transmitted and a reflective axis perpendicular to the transmissive axes. In the present specification and the claims, the "transmissive axis" is referred to as an axis along which light oscillating in the same plane as the transmissive axis is transmitted, and the "reflective axis" is referred to as an axis along which light oscillating in the same plane as the reflective axis is reflected. When EML 25 emits vertically polarized light and horizontally polarized light, each one of first and second optical layers 21 and 28 transmits polarized light parallel with the respective transmissive axis, and reflects polarized light in other directions than the direction parallel with the respective transmissive axis. The transmissive axes of first and second optical layers 21 and 28 are perpendicular to each other.

First and second optical layers 21 and 28 may be formed by coating polarizing materials on outer surfaces 211 and 271 of first and second electrodes 22 and 27, respectively. Alternatively, first and second optical layers 21 and 28 may be formed of linearly reflective type polarizing materials. The polarizing materials may be out-coupling efficiency enhancing films such as double brightness enhanced films (DBEFs).

An upper substrate (not shown) may be formed on second optical layer 28 and correspond to the lower substrate. The upper substrate may be formed of a transparent glass material including silicon dioxide ($SiO_2$) as a main component but is not limited thereto. The upper substrate may be formed of a transparent plastic material, a metallic material, or the like.

The lower substrate and the upper substrate may be bonded to each other using a sealant (not shown). The sealant may be a glass frit.

A polarized state of internal light transmitted through layers of the double-sided light-emitting display device will now be described with reference to FIG. 2.

As shown in FIG. 2, polarization process A refers to a process in which the internal light proceeds toward second electrode 27 and is polarized through the layers of the double-sided light-emitting display device, and polarization process B refers to a process in which the internal light proceeds toward first electrode 22 and is polarized through the layers of the double-sided light-emitting display device.

In polarization process A, internal light L is emitted from EML 25 as polarized light in a random direction. Light L1 of internal light L proceeds toward second electrode 27, and light L4 of internal light L proceeds toward first electrode 22. Internal light L1 passes through functional layer 26 and second electrode 27, and reaches second optical layer 28. At second optical layer 28, linearly polarized light L2 of internal light L1 parallel with the transmissive axis of second optical layer 28 passes through second optical layer 28, and linearly polarized light L3 of internal light L1 perpendicular to the transmissive axis of second optical layer 28 is reflected from second optical layer 28. The reflected polarized light L3 proceeds toward first electrode 22 and passes through first optical layer 21 having the transmissive axis parallel with the reflected polarized light L3.

In polarization process B, internal light L is emitted from EML 25 as polarized light in a random direction. Internal light L4 passes through functional layer 24 and first electrode 22, and reaches first optical layer 21. At first optical layer 21, linearly polarized light L5 of internal light L4 parallel with the transmissive axis of first optical layer 21 passes through first optical layer 21, and linearly polarized light L6 of internal light L4 perpendicular to the transmissive axis of first optical layer 21 is reflected from first optical layer 21. The reflected polarized light L6 proceeds toward second electrode 27 and passes through second optical layer 28 having the transmissive axis parallel with the reflected polarized light L6.

Therefore, optical layers having transmissive axes perpendicular to each other are respectively positioned on a top-emission part and a bottom-emission part of a double-sized light emitting display device to reduce loss of internal light and to emit linearly polarized light having improved out-coupling efficiency.

In the present embodiment, the transmissive axis of second optical layer 28 is perpendicular to a substrate, and the transmissive axis of first optical layer 21 is parallel with the substrate. However, an opposite case is possible. That is, the transmissive axis of second optical layer 28 may be parallel with a substrate, and the transmissive axis of first optical layer 21 may be perpendicular to the substrate.

Figure 3A:
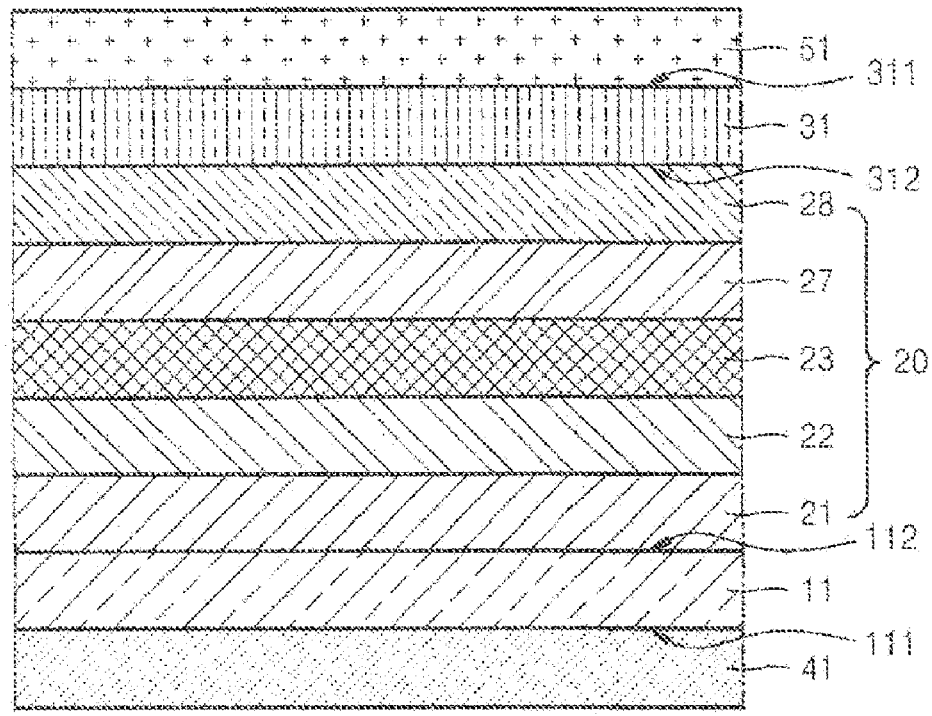
FIG. 3A is a schematic cross-sectional view of a double-sided light-emitting display device constructed as another embodiment according to the principles of the present invention.
Figure 3B:
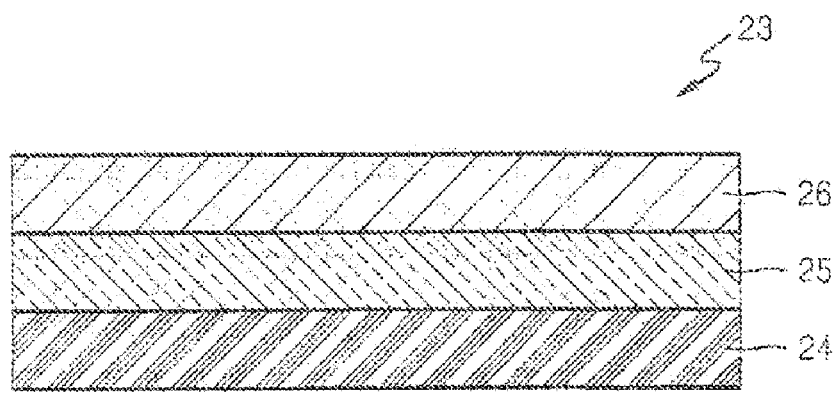
FIG. 3B is a schematic cross-sectional view of an intermediate layer disposed within the double-sided light-emitting display device of FIG. 3A.
Figure 4:
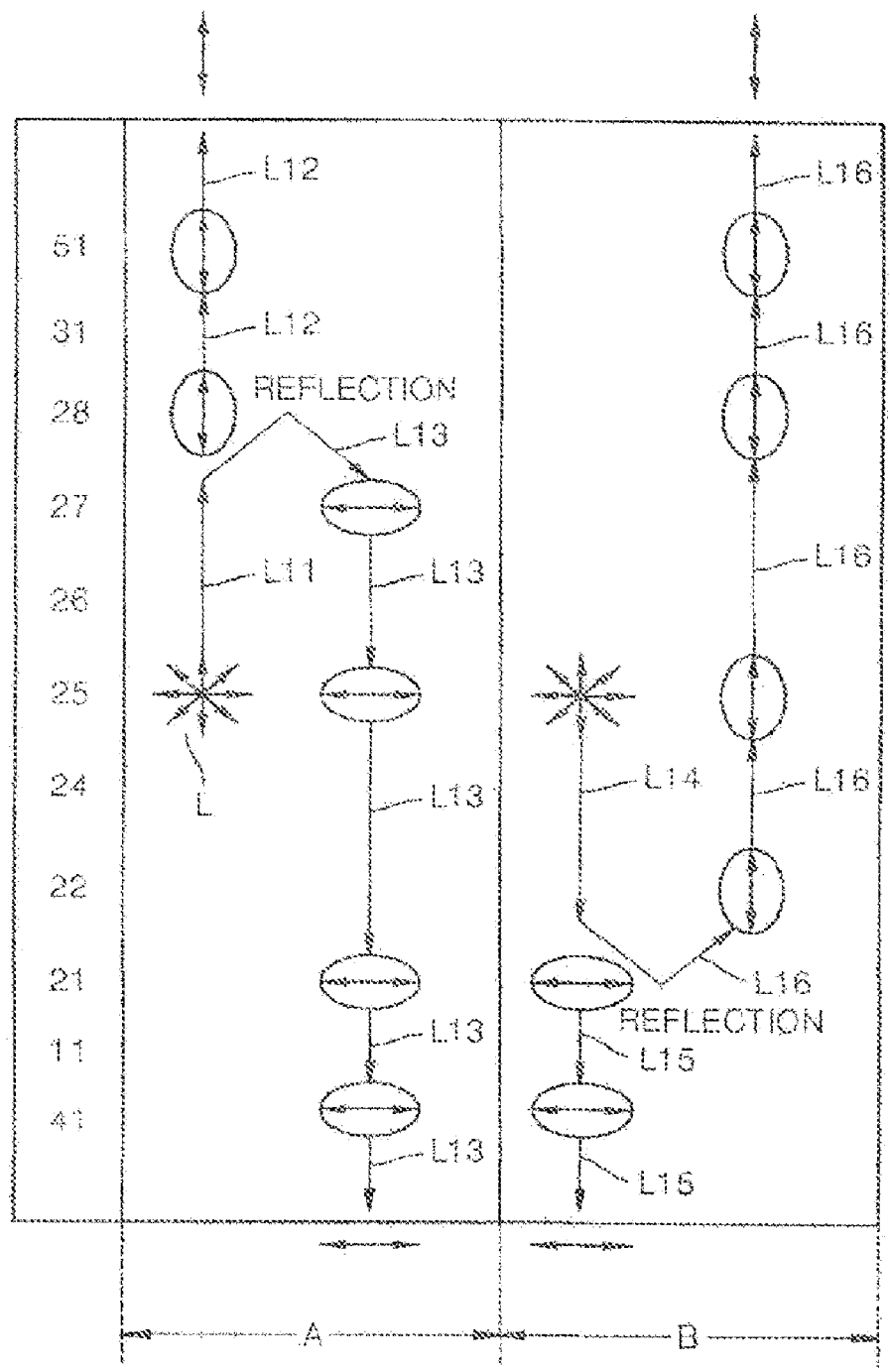
FIG. 4 illustrates a polarized state of internal light emitted from the double-sided light-emitting display device of FIGS. 3A and 3B.
Figure 5:
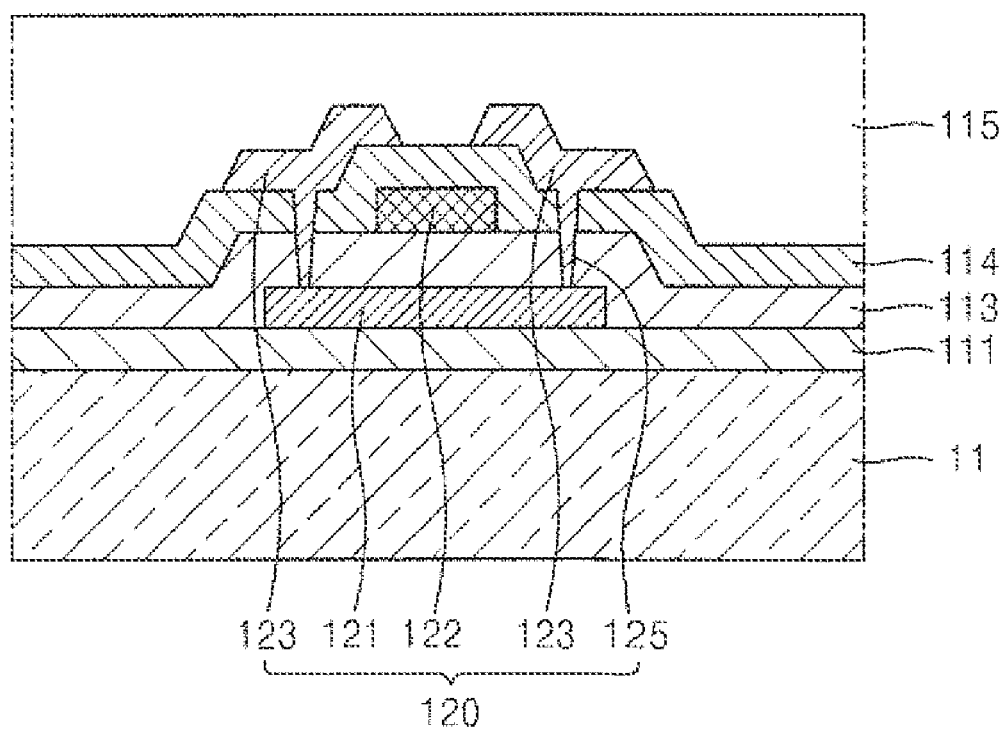
FIG. 5 is a schematic cross-sectional view of a low-temperature polycrystalline silicon (LTPS) layer formed on a lower substrate of the double-sided light-emitting display device of FIG. 3A.

FIG. 3A is a schematic cross-sectional view of a double-sided light-emitting display device constructed as another embodiment according to the principles of the present invention. FIG. 3B is a schematic cross-sectional view of an intermediate layer disposed within the double-sided light-emitting display device of FIG. 3A. FIG. 4 is a diagram illustrating a polarized state of internal light emitted from double-sided light-emitting display device of FIGS. 3A and 3B. FIG. 5 is a schematic cross-sectional view of a low-temperature polycrystalline silicon (LTPS) layer formed on a lower substrate 11 of the double-sided light-emitting display device of FIG. 3A.

Referring to FIG. 3A, the double-sided light-emitting display device includes lower substrate 11, an organic light-emitting diode (OLED) 20, an upper substrate 31 bonded to lower substrate 11, and first and second polarizing members 41 and 51 respectively formed on surfaces of lower and upper substrates 11 and 31. OLED 20 includes a first electrode 22, a second electrode 27 opposite to first electrode 22, an intermediate layer 23 disposed between first and second electrodes 22 and 27, and first and second optical layers 21 and 28 respectively formed on surfaces of first and second electrodes 22 and 27.

Lower substrate 11 may be formed of a transparent glass material including $SiO_2$ as a main component but is not limited thereto. Lower substrate 11 may be formed of a transparent plastic material, a metallic material, or the like.

First optical layer 21 is formed on lower substrate 11. First optical layer 21 has a transmissive axis along which light oscillating in a specific direction is transmitted and a reflective axis perpendicular to the transmissive axis. Therefore, first optical layer 21 transmits light polarized in a specific direction parallel with the transmissive axis and reflects light polarized in a direction perpendicular to the specific direction. First optical layer 21 may be formed of a reflective type polarizing material, for example, may be formed of an out-coupling enhancing film, such as a DBEF.

First electrode 22 is formed on first optical layer 21. First electrode 22 functions as an anode electrode or a cathode electrode. First electrode 22 may be a transflective electrode. First electrode 22 may include a transflective layer, and may further include a transparent layer formed on the transflective layer. Here, the transflective layer may be formed of Ag, Mg, Al, Pt, Pd, Au, Ni, Nd, Ir, Cr, or a compound of Ag, Mg, Al, Pt, Pd, Au, Ni, Nd, Ir, and Cr. The transparent layer may be formed of ITO, IZO, ZnO, or $In_2O_3$, and may be formed on the transflective layer.

An intermediate layer 23 is formed on first electrode 22. Intermediate layer 23 may be formed of a low or high molecular weight organic material.

If intermediate layer 23 is formed of the low molecular weight organic material, a HIL, a HTL, an EML, an ETL, an EIL, and the like may be stacked in a single stack structure or a multi-stack structure to form intermediate layer 23. The low molecular weight organic material may be CuPc, NPB, Alq3, or the like. These low molecular weight organic materials may be formed using masks and a vacuum evaporation method.

If intermediate layer 23 is formed of the high molecular weight organic material, intermediate layer 23 may include a HTL and an EML. Here, the HTL may be formed of a PEDOT, and the EML may be formed of a high molecular weight organic material such as a PPV-based material or a PFO-based material.

Intermediate layer 23 may include R, G, and B EMLs in each pixel, and an optical distance between first and second electrodes 21 and 27 of each pixel may be controlled using auxiliary layers having different thicknesses in different pixels.

Second electrode 27 is formed on intermediate layer 23. Second electrode 27 functions as a cathode electrode or an anode electrode and corresponds to first electrode 22. Second electrode 27 may be a transflective electrode and may be formed of Ag, Mg, Al, Pt, Pd, Au, Ni, Nd, Ir, Cr, or a compound of Ag, Mg, Al, Pt, Pd, Au, Ni, Nd, Ir, and Cr.

Second optical layer 28 is formed on second electrode 27. Second optical layer 28 has a transmissive axis along which light oscillating in a specific direction is transmitted and a reflective axis perpendicular to the transmissive axis. Second optical layer 28 transmits light polarized in a specific direction parallel with the transmissive axis and reflects light polarized in a direction perpendicular to the specific direction. The transmissive axis of second optical layer 28 is perpendicular to the transmissive axis of first optical layer 21. Second optical layer 28 may be formed of a linearly reflective type polarizing material, for example, may be formed of an out-coupling enhancing film such as a DBEF.

Upper substrate 31 is formed on second optical layer 28 and corresponds to lower substrate 11. Upper substrate 31 may be formed of a transparent glass material including $SiO_2$ as a main component but is not limited thereto. Upper substrate 31 may be formed of a transparent plastic material, a metallic material, or the like.

Upper substrate 31 is bonded to lower substrate 11 using a sealant (not shown). The sealant may be a glass frit. Although not shown in the drawings, a passivation layer (or planarization layer) may be additionally formed between upper substrate 31 and second optical layer 28 to planarize lower substrate 11.

First and second polarizing members 41 and 51 are respectively formed on surfaces of lower and upper substrates 11 and 31. Although FIG. 3A illustrates that first and second polarizing members 41 and 51 are respectively formed on outer surfaces 111 and 311 of lower and upper substrates 11 and 31, the present invention is not limited to this structure. That is, first and second polarizing members 41 and 51 may be formed on inner surfaces 112 and 312 of lower and upper substrates 11 and 31. Or, alternatively, first polarizing member 41 may be formed on outer surface 111 of lower substrate 11, and second polarizing member 51 may be formed on inner surface 312 of upper substrate 31. Still alternatively, first polarizing member 41 may be formed on inner surface 112 of lower substrate 11, and second polarizing member 51 may be formed on outer surface 311 of upper substrate 31.

First and second polarizing members 41 and 51 are respectively formed on paths of light emitted from lower and upper substrates 11 and 31. First and second polarizing members 41 and 45 transmit only light oscillating in the same direction as their respective polarization axes but absorb or reflect light oscillating in other directions, wherein the lights correspond to light proceeding from an internal part toward an external part. The polarization axes of first and second polarizing members 41 and 45 are perpendicular to each other. First polarizing member 41 has a polarization axis parallel with the transmissive axis of first optical layer 21, and second polarizing member 45 has a polarization axis parallel with the transmissive axis of second optical layer 28.

First and second polarizing members 41 and 45 may be formed of linearly polarizing plates or linearly polarizing films and may have a single layer structure or a stack structure to have polarization axes parallel with transmissive axes of adjacent optical layers.

A polarized state of internal light transmitted through the layers of the double-sided light-emitting display device will now be described with reference to FIG. 4.

As show in FIG. 4, polarization process A refers to a process in which internal light proceeds toward upper substrate 31 and passes through the layers, and polarization process B refers to a process in which internal light proceeds toward lower substrate 11 and passes through the layers.

In polarization process A, internal light L is emitted from EML 25 as polarized light in a random direction. Internal light L11 passes through functional layer 26 and second electrode 27, and reaches second optical layer 28. At second optical layer 28, polarized light 12 of internal light 11 parallel with the transmissive axis of second optical layer 28 passes through second optical layer 28. Polarized light 13 of internal light L11 perpendicular to the transmissive axis of second optical layer 28 is reflected from second optical layer 28. Since polarized light L12, which has passed through second optical layer 28, is parallel with the polarization axis of second polarizing member 51, polarized light L12 passes through second polarizing member 51. The reflected polarized light L13 passes through first optical layer 21 having the transmissive axis parallel with the reflected polarized light L13, and passes through first polarizing member 41 having the polarization axis parallel with the reflected polarized light L13.

In polarization process B, internal light L is emitted from EML 25 as polarized light in a random direction. Internal light L14 transmits through functional layer 24 and first electrode 22. Next, polarized light L15 of internal light L14 parallel with the transmissive axis of first optical layer 21 passes through first optical layer 21. Polarized light L16 of internal light L14 perpendicular to the transmissive axis of first optical layer 21 is reflected from first optical layer 21. Since polarized light L15 that has passed through first optical layer 21 is parallel with the polarization axis of first optical layer 41, polarized light L15 passes through first polarizing member 41. Polarized light L16, which has been reflected from first optical layer 21, passes through second optical layer 28 having the transmissive axis parallel with the reflective polarized light L16, and passes through second polarizing member 51 having the polarization axis parallel with the reflected polarized light L16.

Therefore, optical layers having transmissive axes perpendicular to each other and polarizing members having polarization axes parallel with the transmissive axes of the neighboring optical layers are positioned on a top-emission part and a bottom-emission part of the double-sided light-emitting display device. Thus, loss of internal light is reduced to further improve out-coupling efficiency.

Since first and second polarizing members 41 and 51 absorb about 50% or more of external light, the double-sided light-emitting display device formed with first and second polarizing members 41 and 51 can more greatly reduce reflection of the external light than a double-sided light-emitting display device without polarizing members. Therefore, the double-sided light-emitting display device reduces loss of internal light and reflection of external light.

In the present embodiment, the transmissive axis of second optical layer 28 is perpendicular to lower substrate 11, and the transmissive axis of first optical layer 21 is parallel to lower substrate 11. However, the opposite case is possible.

A low-temperature polycrystalline silicon (LIPS) layer may be formed on lower substrate 11. As shown in FIG. 5, the LIPS layer includes a plurality of organic thin film transistors (TFTs) which are electrically connected to first electrode 22.

Referring to FIG. 5, an insulating layer 111 such as a buffer layer and/or a barrier layer is formed on an upper surface of lower substrate 11 to prevent diffusion of dopant ions and penetration of moisture or air, and to planarize a surface of lower substrate 11.

A TFT 120 is formed as a driving circuit on insulating layer 111. In the present embodiment, TFT 120 is a top gate type TFT. However, TFT 120 may be a TFT having a different structure from the top gate type TFT.

An active layer 121 of TFT 120 is formed of a semiconductor material and partially on insulating layer 111, and a gate insulating layer 113 is formed to cover active layer 121. Active layer 121 may be formed of an inorganic semiconductor such as amorphous silicon or polysilicon, but is not limited thereto. Active layer 121 may include a source region, a drain region, and a channel region formed between the source and drain regions.

A gate electrode 122 is formed on gate insulating layer 113, and an interlayer insulating layer 114 is formed to cover gate electrode 122. Source/drain electrodes 123 and a planarizing layer 115 are sequentially formed on interlayer insulating layer 114 in the order stated. Source/drain electrodes 123 are connected to active layer 121 through contact holes 125 formed in gate insulating layer 113, and planarizing layer 115 covers source and drain electrodes 123.

A stack structure of a TFT as described above is not limited thereto. TFTs having various types of structures may be used.

First electrode 22 of an OLED is formed on planarizing layer 115 and is electrically connected to source/drain electrodes 123 through a viahole (not shown) formed in planarizing layer 115.

Table 1 below compares out-coupling efficiencies of a double-sided light-emitting display device including the optical layers and the polarizing members positioned on a top-emission part and a bottom-emission part constructed as the second embodiment according to the principles of the present invention, with out-coupling efficiencies of a double-sided light-emitting display device including only the polarizing members, without optical layers.

TABLE 1

|  |  | Top-emission Part (cd/A) | Bottom-emission part (cd/A) | Top-emission + Bottom-emission (cd/A) | After passing through polarizing members (cd/A) |
|---|---|---|---|---|---|
| Embodiment | R | 12.47 | 17.09 | 29.56 | 28.37 |
|  | G | 11.96 | 16.15 | 28.10 | 26.98 |
|  | B | 1.38 | 1.99 | 3.38 | 3.24 |
| Comparison Example | R | 9.68 | 17.86 | 27.54 | 13.22 |
|  | G | 6.67 | 21.15 | 27.82 | 13.35 |
|  | B | 0.75 | 3.01 | 3.76 | 1.80 |

Referring to Table 1, the double-sided light-emitting display device including the optical layers and the polarizing members improves out-coupling efficiency by a range between 80% and 115% in comparison with the double-sided light-emitting display device not including the optical layers.

In the above-described embodiments, optical layers and polarizing members may be respectively positioned on a top-emission part and a bottom-emission part of a double-sided light-emitting display device. The optical layers and the polarizing members may be, however, selectively formed on only one of the top-emission and bottom-emission parts.

As described above, a double-sided light-emitting display device may include optical layers on outer surfaces of transflective electrodes to emit linearly polarized light from both sides of the double-sided light-emitting display device, and the optical layers may have transmissive axes perpendicular to each other.

Also, the double-sided light-emitting display device may further include polarizing members having polarization axes parallel with the transmissive axes of the neighboring optical layers to greatly reduce loss of internal light and reflection of external light. Therefore, the double-sided light-emitting display device has high brightness and a long lifespan due to the improvement in the out-coupling efficiency.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A double-sided light-emitting display device, comprising:
    a first electrode;
    a second electrode opposite to the first electrode;
    an emission layer (EML) disposed between the first and second electrodes;
    a first optical layer formed on a surface of the first electrode; and
    a second optical layer formed on a surface of the second electrode,
    the first and second optical layers having transmissive axes perpendicular to each other,
    each one of the first and second optical layers comprises linearly reflective type polarizing materials.

2. The double-sided light-emitting display device of claim 1, wherein,
    the first optical layer is positioned on an outer surface of the first electrode facing an exterior of the double-sided light-emitting display device, and
    the second optical layer is positioned on an outer surface of the second electrode facing an opposite exterior of the double-sided light-emitting display device.

3. The double-sided light-emitting display device of claim 1, wherein the linearly reflective type polarizing materials are double brightness enhanced films (DBEFs).

4. The double-sided light-emitting display device of claim 1, wherein each one of the first and second optical layers has a reflective axis perpendicular to the respective transmissive axis.

5. The double-sided light-emitting display device of claim 1, wherein the first electrode is a transflective electrode.

6. The double-sided light-emitting display device of claim 1, wherein the first electrode comprises either a transflective layer, or a transflective layer and a transparent layer formed on the transflective layer.

7. The double-sided light-emitting display device of claim 1, wherein the second electrode is a transflective electrode.

8. The double-sided light-emitting display device of claim 1, comprised of:
    the first optical layer having a reflective axis perpendicular to the transmissive axis of the first optical layer, and the second optical layer having a reflective axis perpendicular to the transmissive axis of the second optical layer, and
    a polarized light reflected at the first optical layer passing through the second optical layer, and a polarized light reflected at the second optical layer passing through the first optical layer.

9. A double-sided light-emitting display device, comprising:
    a first electrode;
    a second electrode opposite to the first electrode;
    an emission layer (EML) disposed between the first and second electrodes;
    a first optical layer formed on a surface of the first electrode;
    a second optical layer formed on a surface the second electrode, the first and second optical layers having transmissive axes perpendicular to each other;
    a first polarizing member positioned on a path of light emitted from the emission layer, passing through the first optical layer toward an exterior of the double-sided light-emitting display device; and
    a second polarizing member positioned on a path of light emitted from the emission layer, passing through the second optical layer toward an opposite exterior of the double-sided light-emitting display device,
    each one of the first and second optical layers comprises linearly reflective type polarizing materials.

10. The double-sided light-emitting display device of claim 9, wherein the first optical layer is positioned on an outer surface of the first electrode, and the second optical layer is positioned on an outer surface of the second electrode, with the outer surface of the first electrode and the outer surface of the second electrode facing an exterior of the double-sided light-emitting display device.

11. The double-sided light-emitting display device of claim 9, wherein a polarization axis of the first polarizing member is parallel with the transmissive axis of the first optical layer, and a polarization axis of the second polarizing member is parallel with the transmissive axis of the second optical layer.

12. The double-sided light-emitting display device of claim 9, wherein the linearly reflective type polarizing materials are double brightness enhanced films (DBEFs).

13. The double-sided light-emitting display device of claim 9, wherein each one of the first and second optical layers has a reflective axis perpendicular to the respective transmissive axis.

14. The double-sided light-emitting display device of claim 9, wherein each one of the first and second polarizing members is a linearly polarizing plate.

15. The double-sided light-emitting display device of claim 9, wherein the first electrode is a transflective electrode.

16. The double-sided light-emitting display device of claim 9, wherein the first electrode comprises either a transflective layer, or a transflective layer and a transparent layer formed on the transflective layer.

17. The double-sided light-emitting display device of claim 9, wherein the second electrode is a transflective electrode.

18. The double-sided light-emitting display device of claim 9, comprised of the first optical layer having a reflective axis perpendicular to the transmissive axis of the first optical layer, and the second optical layer having a reflective axis perpendicular to the transmissive axis of the second optical layer, and a polarized light reflected at the first optical layer passing through the second optical layer, and a polarized light reflected at the second optical layer passing through the first optical layer.

* * * * *